(12) United States Patent
Kinsho et al.

(10) Patent No.: US 6,399,274 B1
(45) Date of Patent: Jun. 4, 2002

(54) RESIST COMPOSITION AND PATTERNING PROCESS

(75) Inventors: Takeshi Kinsho; Tsunehiro Nishi; Koji Hasegawa; Takeru Watanabe; Jun Hatakeyama, all of Nakakubiki-gun (JP)

(73) Assignee: Shin-Etsu Chemical Co., LTD, Tokyo (JP)

( * ) Notice: Subject to any disclaimer, the term of this patent is extended or adjusted under 35 U.S.C. 154(b) by 0 days.

(21) Appl. No.: 09/694,706

(22) Filed: Oct. 24, 2000

(30) Foreign Application Priority Data

Oct. 25, 1999 (JP) ............................. 11-302948

(51) Int. Cl.[7] .............................. G03F 7/004
(52) U.S. Cl. .................... 430/270.1; 430/326
(58) Field of Search ............... 430/921, 270.1, 430/286.1, 326

(56) References Cited

U.S. PATENT DOCUMENTS 6,103,449 A * 8/2000 Sato ..................... 430/270.1
6,136,499 A * 10/2000 Goodall et al. .......... 430/270.1

FOREIGN PATENT DOCUMENTS

| WO | 9733198 | 9/1997 |
| WO | 9942510 | 8/1999 |

OTHER PUBLICATIONS

Park et al. :Proced. of the SPIE– the international society for optical engineering, vol. 3333, No. 1; Feb. 25, 1998.
JP 10120767 english abstract.

* cited by examiner

*Primary Examiner*—Rosemary Ashton
(74) *Attorney, Agent, or Firm*—Millen, White, Zelano & Branigan, P.C.

(57) ABSTRACT

A resist composition contains as a base resin a polymer comprising recurring units of the formula (1-1) or (1-2) and having a Mw of 1,000–500,000.

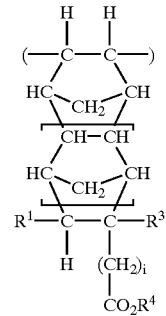

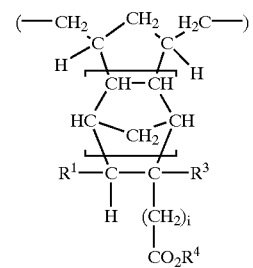

$R^1$ is H, methyl or $CO_2R^2$, $R^2$ is a straight, branched or cyclic $C_{1-15}$ alkyl group, $R^3$ is hydrogen, methyl or $CH_2CO_2R^2$, $R^4$ is an acid labile group, i is an integer of 1 to 4, and k is equal to 0 or 1. The resist composition has significantly improved sensitivity, resolution and etching resistance and is very useful in precise microfabrication.

8 Claims, No Drawings

RESIST COMPOSITION AND PATTERNING PROCESS

This invention relates to (1) a resist composition comprising as a base resin a polymer having highly reactive, acid lability-imparting units and especially suited as micropatterning material for VLSI fabrication, and (2) a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 µm or less.

The resist materials for use in photolithography using light of an excimer laser, especially ArF excimer laser having a wavelength of 193 nm, are, of course, required to have a high transmittance to light of that wavelength. In addition, they are required to have an etching resistance sufficient to allow for film thickness reduction, a high sensitivity sufficient to eliminate any extra burden on the expensive optical material, and especially, a high resolution sufficient to form a precise micropattern. To meet these requirements, it is crucial to develop a base resin having a high transparency, rigidity and reactivity. None of the currently available polymers satisfy all of these requirements. Practically acceptable resist materials are not yet available.

Known high transparency resins include copolymers of acrylic or methacrylic acid derivatives and polymers containing in the backbone an alicyclic compound derived from a norbornene derivative. All these resins are unsatisfactory. For example, copolymers of acrylic or methacrylic acid derivatives are relatively easy to increase reactivity in that highly reactive monomers can be introduced and acid labile units can be increased as desired, but difficult to increase rigidity because of their backbone structure. On the other hand, the polymers containing an alicyclic compound in the backbone have rigidity within the acceptable range, but are less reactive with acid than poly(meth)acrylate because of their backbone structure, and difficult to increase reactivity because of the low freedom of polymerization. Therefore, some resist compositions which are formulated using these polymers as the base resin, fail to withstand etching although they have satisfactory sensitivity and resolution. Some other resist compositions are highly resistant to etching, but have low sensitivity and low resolution below the practically acceptable level.

SUMMARY OF THE INVENTION

An object of the invention is to provide (1) a resist composition comprising a polymer having improved reactivity and rigidity as a base resin and achieving significantly surpassing sensitivity, resolution and etching resistance over prior art compositions, and (2) a patterning process using the resist composition.

It has been found that a polymer comprising recurring units of the following general formula (1-1) or (1-2) and having a weight average molecular weight of 1,000 to 500,000 possesses both high rigidity and reactivity, and that a resist composition using the polymer as a base resin has a high sensitivity, high resolution and high etching resistance and is very useful in precise microfabrication.

Accordingly, the invention provides a resist composition comprising as a base resin a polymer comprising recurring units of the following general formula (1-1) or (1-2) and having a weight average molecular weight of 1,000 to 500,000.

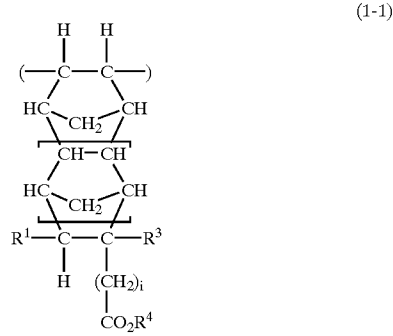

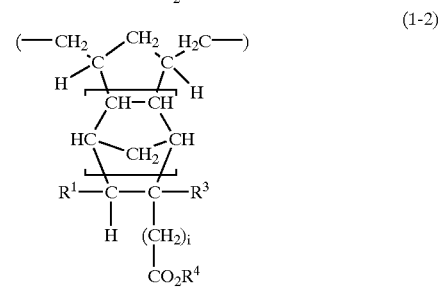

Herein $R^1$ is hydrogen, methyl or $CO_2R^2$, $R^2$ is a straight, branched or cyclic alkyl group of 1 to 15 carbon atoms, $R^3$ is hydrogen, methyl or $CH_2CO_2R^2$, $R^4$ is an acid labile group, i is an integer of 1 to 4, and k is equal to 0 or 1.

In one preferred embodiment, the polymer comprising recurring units of the general formula (1-1) or (1-2) is a polymer of the following general formula (2), (3) or (4).

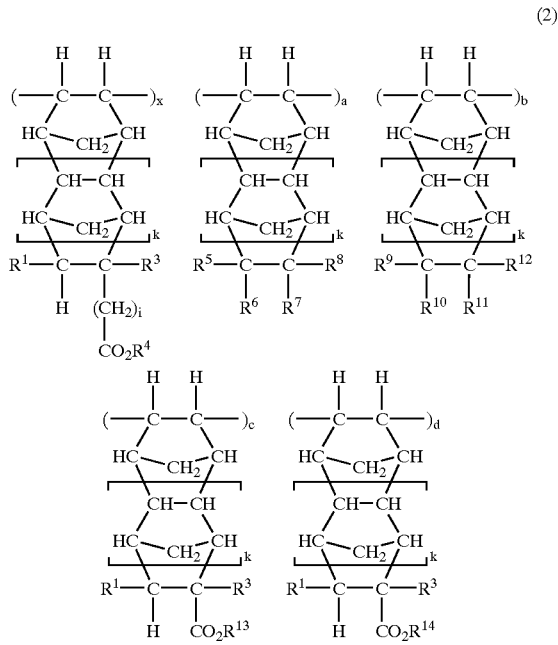

-continued

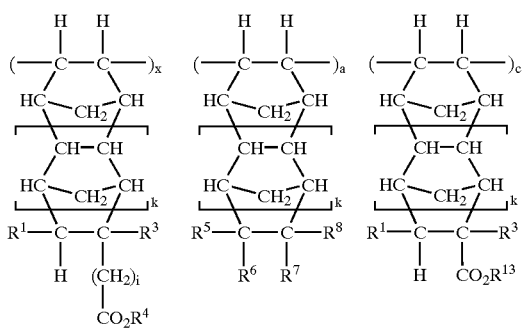

(3)

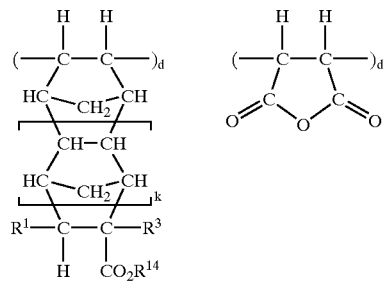

(4)

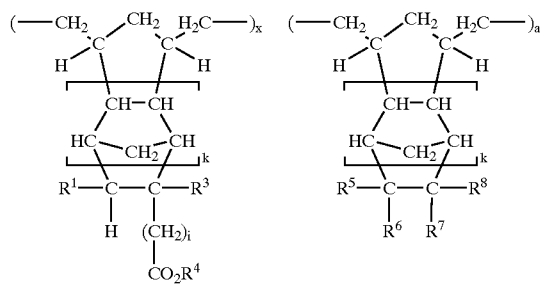

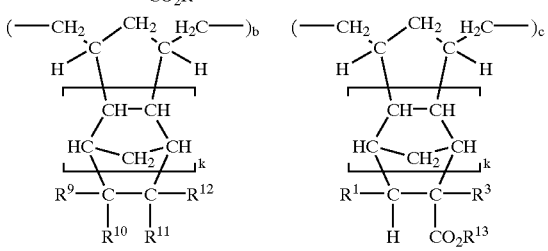

Herein

R$^1$ to R$^4$, i and k are as defined above, at least one of R$^5$ to R$^8$ is a carboxyl or hydroxyl-containing monovalent hydrocarbon group of 1 to 15 carbon atoms, and the remainder are independently hydrogen or a straight, branched or cyclic alkyl group of 1 to 15 carbon atoms, or R$^5$ to R$^8$, taken together, may form a ring, and when they form a ring, at least one of R$^5$ to R$^8$ is a carboxyl or hydroxyl-containing divalent hydrocarbon group of 1 to 15 carbon atoms, and the are independently a single bond or a straight, branched or cyclic alkylene group of 1 to 15 carbon atoms, at least one of R$^9$ to R$^{12}$ is a monovalent hydrocarbon group of 2 to 15 carbon atoms containing a —CO2— partial structure, and the remainder are independently hydrogen or a straight, branched or cyclic alkyl group of 1 to 15 carbon atoms, or R$^9$ to R$^{12}$, taken together, may form a ring, and when they form a ring, at least one of R$^9$ to R$^{12}$ is a divalent hydrocarbon group of 1 to 15 carbon atoms containing a —CO2— partial structure, and the remainder are independently a single bond or a straight, branched or cyclic alkylene group of 1 to 15 carbon atoms, R$^{13}$ is a polycyclic hydrocarbon group of 7 to 15 carbon atoms or an alkyl group containing such a polycyclic hydrocarbon group, R$^{14}$ is an acid labile group, x is a number from more than 0 to 1, "a" to "e" are numbers from 0 to less than 1, satisfying x+a+b+c+d+e=1.

In a further preferred embodiment, the acid labile group represented by R$^4$ in the general formula (2), (3) or (4) contains a group of the following general formula (5) or (6).

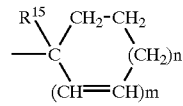

(5)

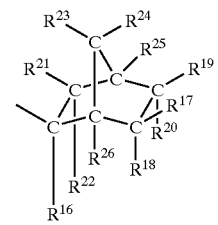

(6)

Herein

R$^{15}$ is a straight, branched or cyclic alkyl group of 1 to 8 carbon atoms or substituted or unsubstituted aryl group of 6 to 20 carbon atoms, R$^{16}$ is a straight, branched or cyclic alkyl group of 1 to 8 carbon atoms or substituted or unsubstituted aryl group of 6 to 20 carbon atoms, R$^{17}$ to R$^{26}$ are independently hydrogen or monovalent hydrocarbon groups of 1 to 15 carbon atoms which may contain a hetero atom, or R$^{17}$ to R$^{26}$, taken together, may form a ring, and R$^{17}$ to R$^{26}$ represent divalent hydrocarbon groups of 1 to 15 carbon atoms which may contain a hetero atom when they form a ring, or two of R17 to R$^{26}$ which are attached to adjoining carbon atoms may bond together directly to form a double bond, m is a number equal to 0 or 1, n is a number equal to 0, 1, 2 or 3, satisfying 2m+n=2 or 3.

In another aspect, the invention provides a process for forming a resist pattern comprising the steps of applying a resist composition as defined above onto a substrate to form a coating; heat treating the coating and then exposing it to high-energy radiation or electron beams through a photo mask; and optionally heat treating the exposed coating and developing it with a developer.

In the recurring units of formula (1-1) or (1-2), a spacer of 1 to 4 carbon atoms is introduced between the condensed ring skeleton and the acid labile group-blocked carboxylic acid site. This polymer is more reactive with acid as compared with prior art polymers in which the blocked carboxylic acid is directly attached to the ring. Although the reason is not well understood, it is believed that as a phenomenon inherent to polymers, the insertion of a spacer of an appropriate length into the complex intertwining of backbones enables to enhance the degree of baring or exposure of reactive sites, leading to an increased acid contact probability, as compared with the direct bond type in which reactive sites are rather buried. When the polymer is used in a resist composition, the degree of baring of carboxylic acid upon deblocking is so high that a significant improvement in dissolution rate is achieved per unit deblocking, leading to a high dissolution contrast. With respect to the spacer length, which depends on the backbone structure, extraneously increasing the number of carbon atoms gives only a little further effect after passing over a certain number and this fact, combined with a decline of rigidity, suggests that the optimum range is up to about four carbon atoms.

Owing to the above effects, the polymer comprising recurring units of formula (1-1) or (1-2) is successful in increasing reactivity with acid while maintaining a high rigidity. The resist composition having the polymer formulated as the base resin has a high sensitivity, resolution and etching resistance and eliminates the drawbacks of prior art resist compositions including poor resolution upon micropatterning and pattern extinction after etching.

DESCRIPTION OF THE PREFERRED EMBODIMENTS

The resist composition of the invention is defined as comprising as a base resin a polymer or high molecular weight compound comprising recurring units of the following general formula (1-1) or (1-2) and having a weight average molecular weight of 1,000 to 500,000, preferably 5,000 to 100,000.

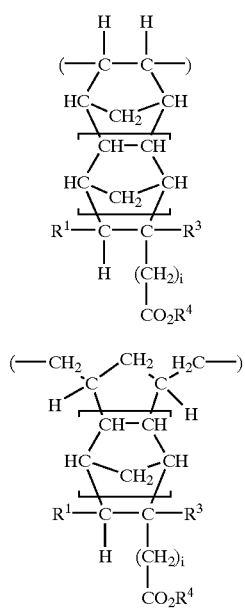

In the above formulae, k is equal to 0 or 1. Accordingly, the formulae (1-1) and (1-2) can be represented by the following formulae (1-1-1) to (1-2-2).

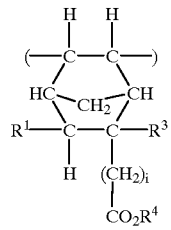

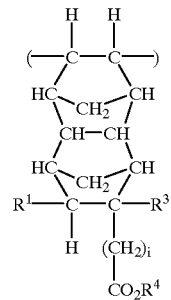

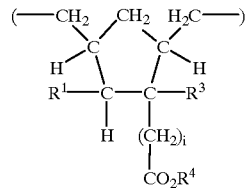

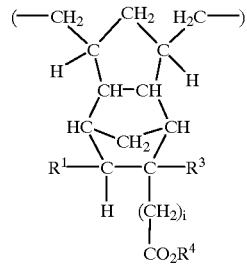

Herein $R^1$ is a hydrogen atom, methyl group or $CO_2R^2$. $R^2$ is a straight, branched or cyclic alkyl group of 1 to 15 carbon atoms, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl. $R^3$ is a hydrogen atom, methyl group or $CH_2CO_2R^2$. $R^4$ is an acid labile group. Letter i is an integer of 1 to 4, preferably 1 to 3, most preferably 1 or 2.

The preferred polymer comprising recurring units of the general formula (1-1) or (1-2) is a polymer or high molecular weight compound of the following general formula (2), (3) or (4).

(2) 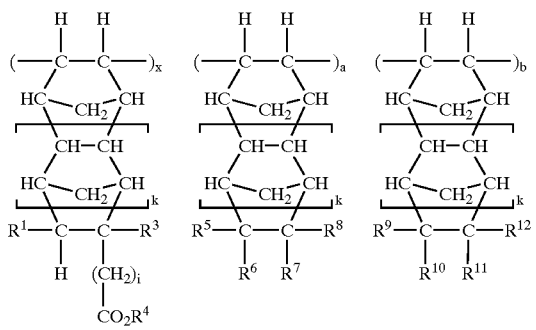

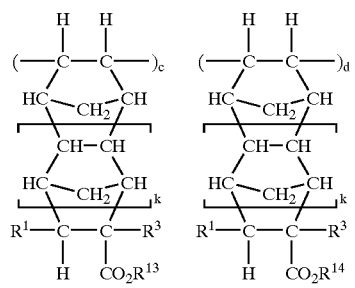

(3) 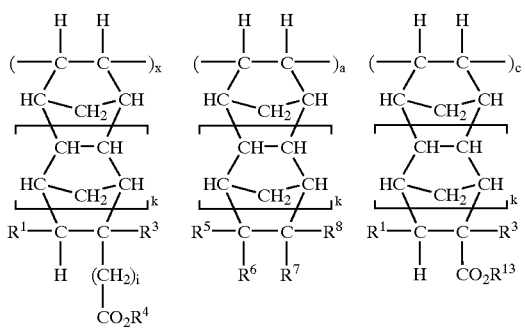

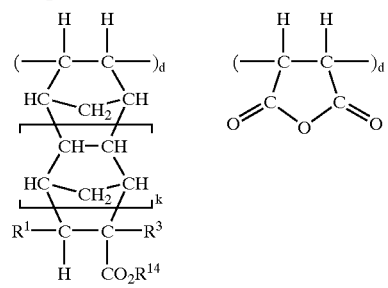

(4) 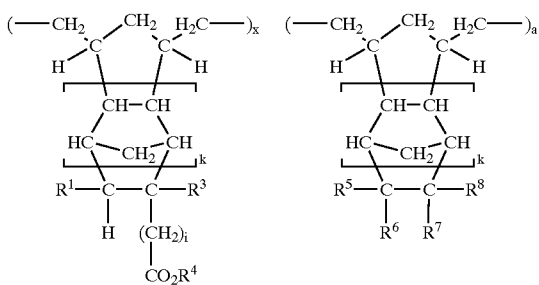

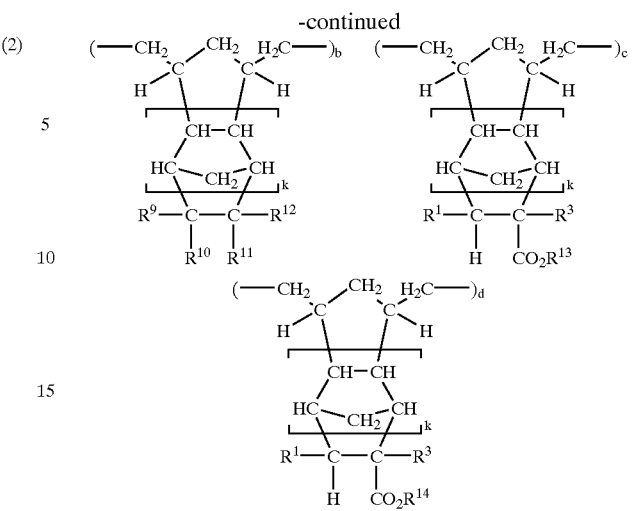

Herein $R^1$ to $R^4$, i and k are as defined above.

At least one of $R^5$ to $R^8$ is a carboxyl or hydroxyl-containing monovalent hydrocarbon group of 1 to 15 carbon atoms (preferably straight, branched or cyclic alkyl group), and the remainders are independently hydrogen or a straight, branched or cyclic alkyl group of 1 to 15 carbon atoms. Examples of the carboxyl or hydroxyl-containing monovalent hydrocarbon group of 1 to 15 carbon atoms include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. The straight, branched or cyclic $C_1$–$C_{15}$ alkyl groups are as exemplified for $R^2$. Alternatively, $R^5$ to $R^8$, taken together, may form a ring. When they form a ring, at least one of $R^5$ to $R^8$ is a carboxyl or hydroxyl-containing divalent hydrocarbon group of 1 to 15 carbon atoms (preferably straight, branched or cyclic alkylene group), and the remainders are independently a single bond or a straight, branched or cyclic alkylene group of 1 to 15 carbon atoms. Examples of the carboxyl or hydroxyl-containing divalent $C_1$–$C_{15}$ hydrocarbon group are those exemplified for the carboxyl or hydroxyl-containing monovalent hydrocarbon group, with one hydrogen atom being eliminated therefrom. Examples of the straight, branched or cyclic $C_1$–$C_{15}$ alkylene group are those exemplified for $R^2$, with one hydrogen atom being eliminated therefrom.

At least one of $R^9$ to $R^{12}$ is a monovalent hydrocarbon group of 2 to 15 carbon atoms containing a —$CO_2$— partial structure, and the remainders are independently hydrogen or a straight, branched or cyclic alkyl group of 1 to 15 carbon atoms. Examples of the monovalent $C_2$–$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl- 2-oxooxolan-5-yloxycarbonyl. Examples of the straight, branched or cyclic $C_1$–$C_{15}$ alkyl group are as exemplified for $R^2$. Alternatively, $R^9$ to $R^{12}$, taken together, may form a ring. When they form a ring, at least one of $R^9$ to $R^{12}$ is a divalent hydrocarbon group of 1 to 15 carbon atoms containing a —$CO_2$— partial structure, and the remainders are independently a single bond or a straight, branched or cyclic alkylene group of 1 to 15 carbon atoms. Examples of the divalent $C_1$–$C_{15}$ hydrocarbon group containing a —$CO_2$— partial structure include 1-oxo-2-oxapropane-1,3diyl, 1,3-dioxo-2-oxapropane-1,3-diyl, 1-oxo-2-oxabutane-1,4-diyl, and 1,3-dioxo-2-oxabutane-1,4-diyl as well as those exemplified above for the monovalent hydrocarbon group containing a —$CO_2$— partial structure, with one hydrogen atom being eliminated therefrom. Examples of the straight, branched or cyclic $C_1$–$C_{15}$ alkylene group are those exemplified for $R^2$, with one hydrogen atom being eliminated therefrom.

$R^{13}$ is a polycyclic hydrocarbon group of 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{14}$ is an acid labile group.

Letter x is a number from more than 0 to 1, preferably 0.1 to 0.9, more preferably 0.2 to 0.8, and "a" to "e" are numbers from 0 to less than 1, satisfying x+a+b+c+d+e=1. Each of "a" to "e" is preferably 0 to 0.7, more preferably 0 to 0.5.

The acid labile groups represented by $R^4$ and $R^{14}$ may be selected from a variety of such groups although groups of the following general formulae (5) and (6) are preferred for high reactivity.

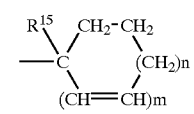
(5)

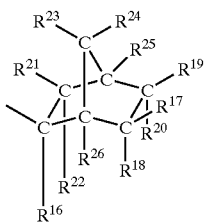
(6)

Herein, $R^{15}$ is a straight, branched or cyclic alkyl group of 1 to 8 carbon atoms or substituted or unsubstituted aryl group of 6 to 20 carbon atoms. Examples of the straight, branched or cyclic alkyl group include methyl, ethyl, propyl, isopropyl, n-butyl, sec-butyl, tert-butyl, tert-amyl, n-pentyl, n-hexyl, cyclopentyl, cyclohexyl, cyclopentylmethyl, cyclopentylethyl, cyclohexylmethyl, and cyclohexylethyl. Exemplary aryl groups are phenyl, methylphenyl, naphthyl, anthryl, phenanthryl, and pyrenyl.

$R^{16}$ is a straight, branched or cyclic alkyl group of 1 to 8 carbon atoms or substituted or unsubstituted aryl group of 6 to 20 carbon atoms. Examples are the same as mentioned for $R^{15}$.

$R^{17}$ to $R^{26}$ are independently hydrogen or monovalent hydrocarbon groups of 1 to 15 carbon atoms which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups.

Alternatively, $R^{17}$ to $R^{26}$, taken together, may form a ring (for example, a pair of $R^{17}$ and $R^{18}$, a pair of $R^{17}$ and $R^{19}$, a pair of $R^{18}$ and $R^{20}$, a pair of $R^{19}$ and $R^{20}$, a pair of $R^{21}$ and $R^{22}$, a pair of $R^{23}$ and $R^{24}$ or a similar pair form a ring). Each of $R^{17}$ to $R^{26}$ represents a divalent hydrocarbon group of 1 to 15 carbon atoms which may contain a hetero atom when they form a ring, examples of which are the ones exemplified above for the monovalent hydrocarbon groups, with one hydrogen atom being eliminated. Two of $R^{17}$ to $R^{26}$ which are attached to adjoining carbon atoms (for example, a pair of $R^{17}$ and $R^{19}$, $R^{19}$ and $R^{25}$, $R^{23}$ and $R^{25}$, or a similar pair) may bond together directly to form a double bond.

Letter m is a number equal to 0 or 1, n is a number equal to 0, 1, 2 or 3, satisfying 2m+n=2 or 3.

Examples of the acid labile groups of formula (5) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (6) are exemplified by the following groups.

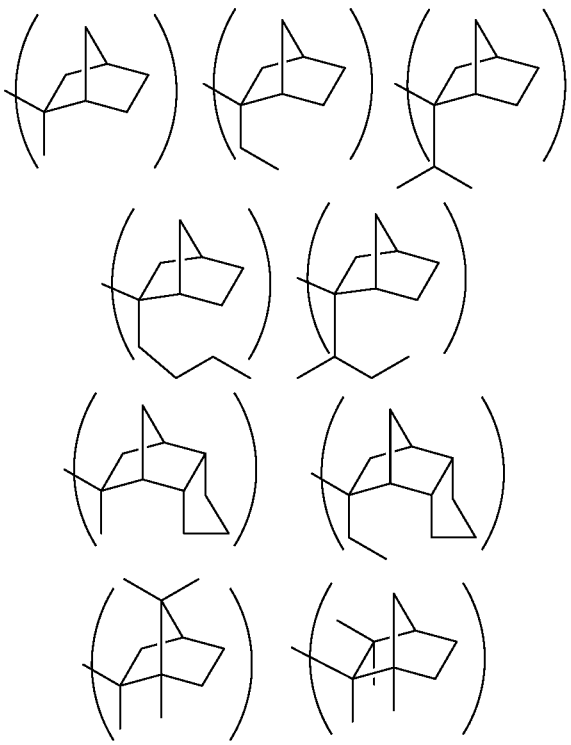

-continued

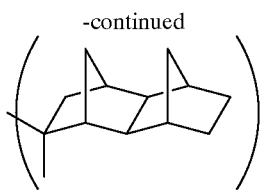

Additionally, the acid labile groups represented by $R^4$ and $R^{14}$ include groups of the following general formulae (L1) and (L2), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

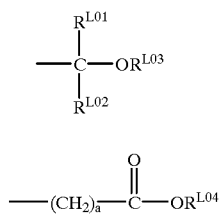

$R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

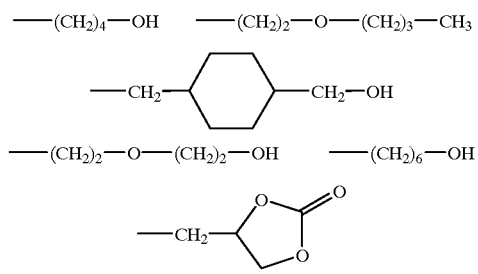

A pair of $R^{L01}$ and $R^{L02}$, $R^{L01}$ and $R^{L03}$, or $R^{L02}$ and $R^{L03}$ may form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-5-oxooxolan-4-yl. Letter a is an integer of 0 to 6.

Of the acid labile groups of formula (L1), the straight and branched ones are exemplified by the following groups.

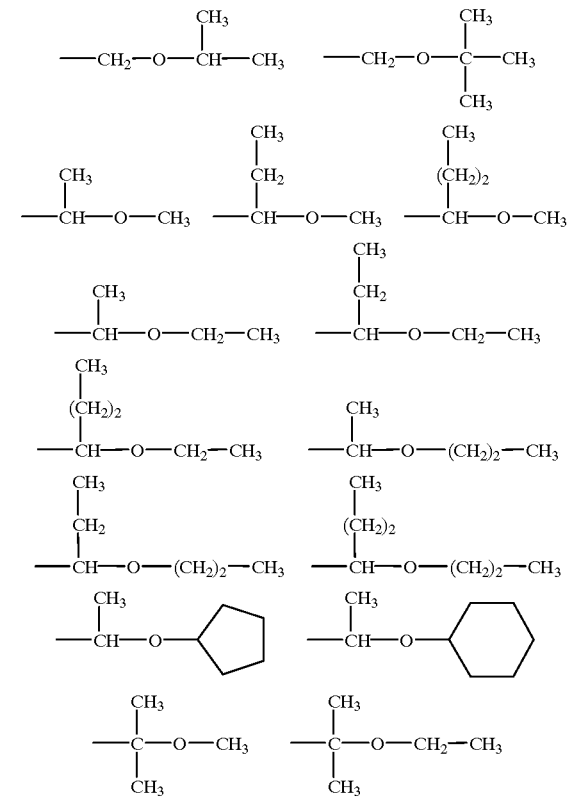

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxy-carbonylmethyl, 2-tetrahydropyranyloxycarbonylmethyl, and 2-tetrahydrofuranyloxycarbonylmethyl groups.

Examples of the tertiary alkyl, trialkylsilyl and oxoalkyl groups included in the acid labile groups represented by $R^4$ and $R^{14}$ are as exemplified above.

As the acid labile group represented by $R^4$ or $R^{14}$, there may be used one type or a combination of two or more types. The use of acid labile groups of different types enables fine adjustment of a pattern profile.

In preparing the polymer comprising recurring units of formula (1-1) or (1-2) according to the invention, copolymerization reaction is effected using a compound of the following general formula (1) as a first monomer and at least one compound of the following general formulae (7) to (11) as a second monomer.

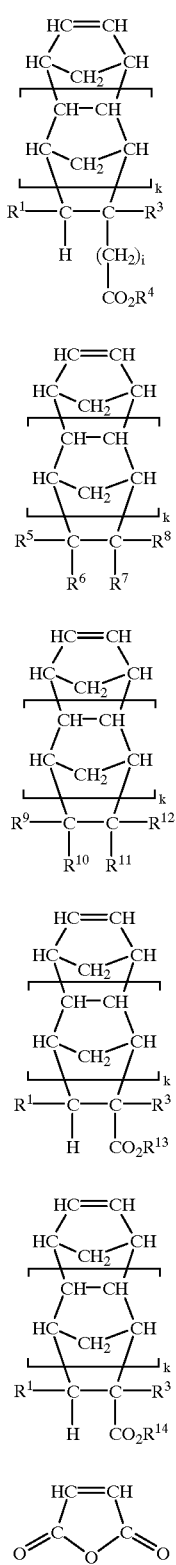

Herein $R^1$ to $R^{14}$ are as defined above.

Copolymerization reaction is carried out by mixing the compound of formula (1) with at least one compound selected from the compounds of formulae (7) to (11) in an appropriate proportion, determined by taking into account a reactivity, optionally dissolving them in a solvent, and adding a suitable polymerization initiator or catalyst. Then reaction is carried out at a suitable temperature for a suitable time. Although various modes are available for copolymerization reaction, a choice is preferably made of radical polymerization, anionic polymerization or coordination polymerization.

For radical polymerization, preferred reaction conditions include (a) a solvent selected from among hydrocarbons such as benzene, ethers such as tetrahydrofuran, alcohols such as ethanol, and ketones such as methyl isobutyl ketone, (b) a polymerization initiator selected from azo compounds such as 2,2'-azobisisobutyronitrile and peroxides such as benzoyl peroxide and lauroyl peroxide, (c) a temperature of about 0° C. to about 100° C., and (d) a time of about ½ hour to about 48 hours. Reaction conditions outside the described range may be employed if desired.

For anionic polymerization, preferred reaction conditions include (a) a solvent selected from among hydrocarbons such as benzene, ethers such as tetrahydrofuran, and liquid ammonia, (b) a polymerization initiator selected from metals such as sodium and potassium, alkyl metals such as n-butyl lithium and sec-butyl lithium, ketyls, and Grignard reagents, (c) a temperature of about −78° C. to about 0° C., (d) a time of about ½ hour to about 48 hours, and (e) a stopper selected from among proton-donative compounds such as methanol, halides such as methyl iodide, and electrophilic compounds. Reaction conditions outside the described range may be employed if desired.

For coordination polymerization, preferred reaction conditions include (a) a solvent selected from among hydrocarbons such as n-heptane and toluene, (b) a catalyst selected from Ziegler-Natta catalysts comprising a transition metal (e.g., titanium) and alkyl aluminum, Phillips catalysts of metal oxides having chromium or nickel compounds carried thereon, and olefin-metathesis mixed catalysts as typified by tungsten and rhenium mixed catalysts, (c) a temperature of about 0° C. to about 100° C., and (d) a time of about ½ hour to about 48 hours. Reaction conditions outside the described range may be employed if desired.

In the copolymerization reaction, the amounts of the respective monomers are adjusted so that the resulting polymer may provide optimum performance when formulated as a resist composition.

The polymers comprising recurring units of formula (1-1) or (1-2) according to the invention have a weight average molecular weight of 1,000 to 500,000, preferably 3,000 to 100,000. Outside the range, the etching resistance may become extremely low and the resolution may become low because a substantial difference in rate of dissolution before and after exposure is lost.

In addition to the polymer comprising recurring units of formula (1-1) or (1-2), the resist composition of the invention may contain a photoacid generator and an organic solvent.

Photoacid generator

The photoacid generator is a compound capable of generating an acid upon exposure to high energy radiation or electron beams and includes the following:
(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives, (vii) disulfone derivatives,
(viii) nitrobenzylsulfonate derivatives, and
(ix) sulfonate derivatives.

These photoacid generators are described in detail.
(i) Onium Salts of Formula (P1a-1), (P1a-2) or (P1b)

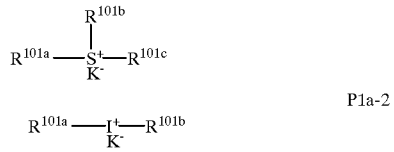

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. K⁻ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by K⁻ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

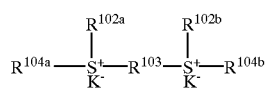

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. K⁻ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1) and (P1a-2).

(ii) Diazomethane Derivatives of Formula (P2)

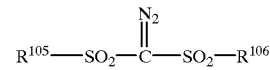

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methyl-phenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

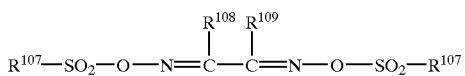

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

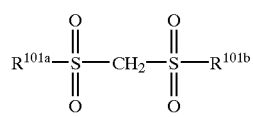

Herein, $R^{101a}$ and $R^{101b}$ are as defined above. (v) Sulfonic acid esters of N-hydroxyimide compounds of formula (P5)

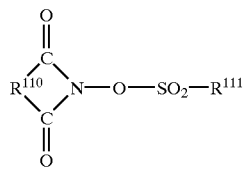

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, 1,2-ethylene, 1,3-propylene, 1,4-butylene, 1-phenyl-1,2-ethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include: onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis-[methyl(2-oxocyclopentyl)sulfonium trifluoromethanesulfonate], and 1,2'-naphthylcarbonylmethyltetrahydro-thiophenium triflate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexyl-carbonyl-2-(p-toluenesulfonyl)propane and 2-isopropyl-carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris-(methanesulfonyloxy)benzene, 1,2,3-tris(trifluoromethanesulfonyloxy)benzene, and 1,2,3-tris(p-toluenesulfonyloxy) benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethyl-benzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2, 3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)dsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate; diazomethane derivatives such as bis(benzenesulfonyl) diazomethane, bis(p-toluenesulfonyl)diazomethane, bis(cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; glyoxime derivatives such as bis-o-(p-toluenesulfonyl)-α-dimethylglyoxime and bis-o-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.1 to 15 parts, and especially 0.5 to 8 parts by weight, per 100 parts by weight of the base resin (all parts are by weight, hereinafter). Less than 0.1 part of the photoacid generator would provide a poor sensitivity whereas more than 15 parts of the photoacid generator would lower the rate of alkali dissolution to reduce the resolution of resist compositions and also lower the heat resistance because of the excessive presence of lower molecular weight components.

Organic solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the 5 photoacid generator serving as one of the resist components is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other polymer

To the resist composition of the invention, another polymer other than the inventive polymer may also be added. The other polymers that can be added to the resist composition are, for example, those polymers comprising units of the following formula (R1) or (R2) and having a weight average molecular weight of about 1,000 to about 500,000, especially about 5,000 to about 100,000 although the other polymers are not limited thereto.

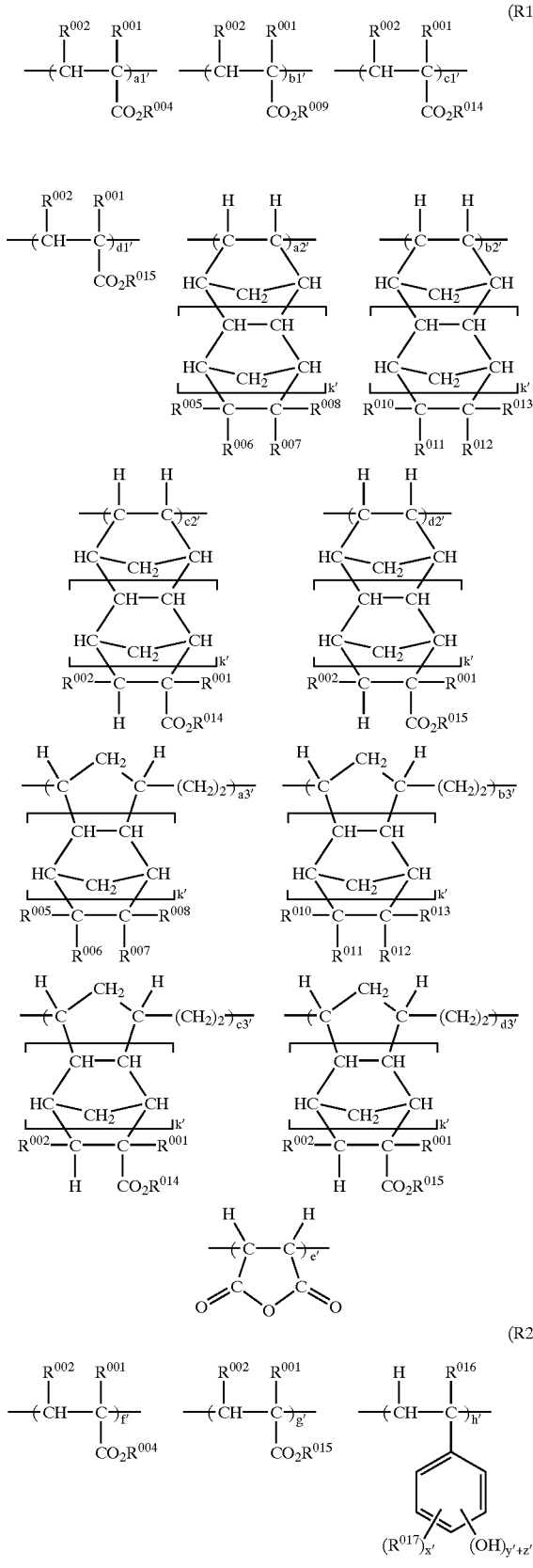

(R1)

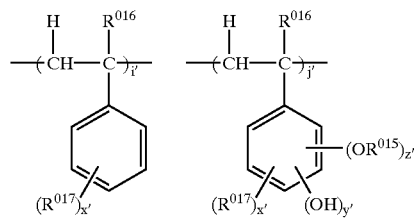

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 3 to 15 carbon atoms containing a —$CO_2$— partial structure. At least one of $R^{010}$ to $R^{013}$ is a monovalent hydrocarbon group of 2 to 15 carbon atoms containing a —$CO_2$— partial structure, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. Letter k' is equal to 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1. Illustrative examples of the respective groups are the same as exemplified for $R^1$ to $R^{26}$.

The inventive polymer (polymer having recurring units of formula (1-1) or (1-2) or polymer of formula (2) to (4)) and the other polymer are preferably blended in a weight ratio from 10:90 to 90:10, more preferably from 20:80 to 80:20. If the blend ratio of the inventive polymer is below this range, the resist composition would become poor in some of the desired properties. The properties of the resist composition can be adjusted by properly changing the blend ratio of the inventive polymer.

The other polymer is not limited to one type and a mixture of two or more other polymers may be added. The use of plural polymers allows for easy adjustment of resist properties.

Dissolution regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

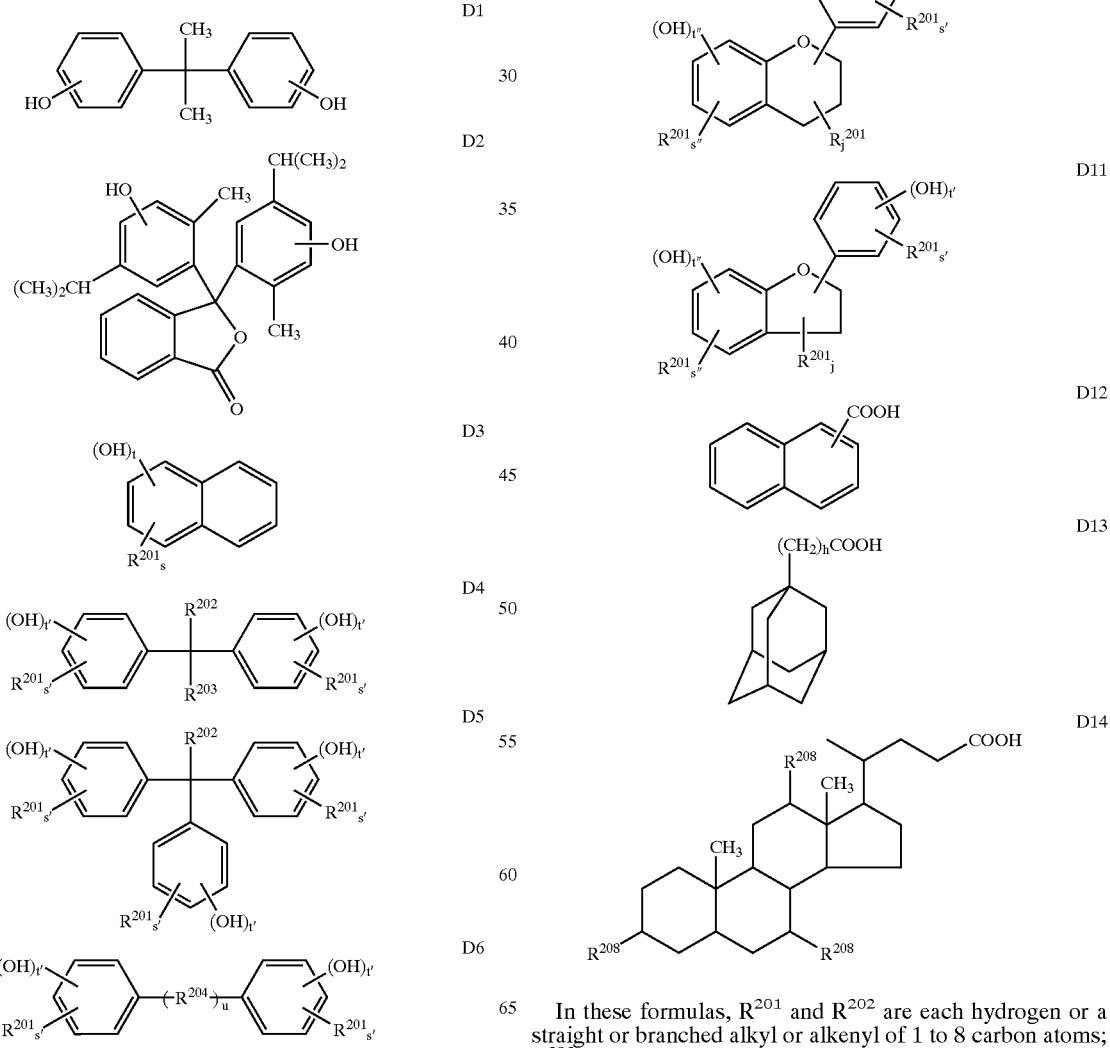

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —(R$^{207}$)$_n$—COOH; R$^{204}$ is —(CH$_2$)$_i$— (where i=2 to 10), an arylene of 6 to 10 carbon atoms, carbonyl, sulfonyl, an oxygen atom, or a sulfur atom; R$^{205}$ is an alkylene of 1 to 10 carbon atoms, an arylene of 6 to 10 carbon atoms, carbonyl, sulfonyl, an oxygen atom, or a sulfur atom; R$^{206}$ is hydrogen, a straight or branched alkyl or alkenyl of 1 to 8 carbon atoms, or a hydroxyl-substituted phenyl or naphthyl; R$^{207}$ is a straight or branched alkylene of 1 to 10 carbon atoms; R$^{208}$ is hydrogen or hydroxyl; the letter j is an integer from 0 to 5; u and h are each 0 or 1; S, t, s', t', s", and t" are each numbers which satisfy s+t=8, s'+t'=5, and s"+t"=4, and are such that each phenyl skeleton has at least one hydroxyl group; and a is a number such that the molecular weight of the compounds of formula (D8) or (D9) is from 100 to 1,000.

In the above formulas, suitable examples of R$^{201}$ and R$^{202}$ include hydrogen, methyl, ethyl, butyl, propyl, ethynyl, and cyclohexyl; suitable examples of R$^{203}$ include the same groups as for R$^{201}$ and R$^{202}$, as well as —COOH and —CH$_2$COOH; suitable examples of R$^{204}$ include ethylene, phenylene, carbonyl, sulfonyl, oxygen, and sulfur; suitable examples of R$^{205}$ include methylene as well as the same groups as for R$^{204}$; and suitable examples of R$^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkyl-silyl groups in which each of the alkyls has 1 to 6 carbon atoms, and oxoalkyl groups of 4 to 20 carbon atoms.

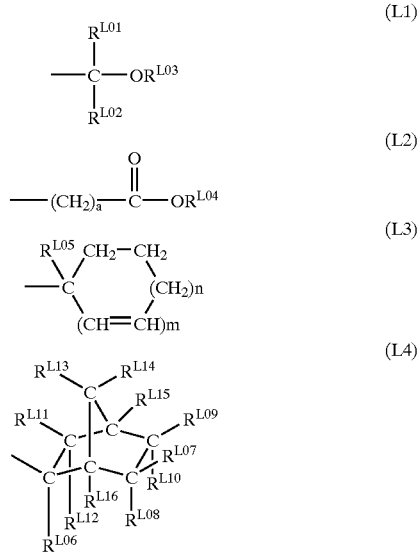

In these formulas, R$^{L01}$ and R$^{L02}$ are each hydrogen or a straight, branched or cyclic alkyl having 1 to 18 carbon atoms; and R$^{L03}$ is a monovalent hydrocarbon group of 1 to 18 carbon atoms which may contain a heteroatom (e.g., oxygen). A pair of R$^{L01}$ and R$^{L02}$, a pair of R$^{L01}$ and R$^{L03}$, or a pair of R$^{L02}$ and R$^{L03}$ may together form a ring, with the proviso that R$^{L01}$, R$^{L02}$, and R$^{L03}$ are each a straight or branched alkylene of 1 to 18 carbon atoms when they form a ring. Also, R$^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). R$^{L05}$ is a straight, branched or cyclic alkyl group of 1 to 8 carbon atoms or a substituted or unsubstituted aryl group of 6 to 20 carbon atoms. R$^{L06}$ is a straight, branched or cyclic alkyl group of 1 to 8 carbon atoms or a substituted or unsubstituted aryl group of 6 to 20 carbon atoms. R$^{L07}$ to R$^{L16}$ independently represent hydrogen or monovalent hydrocarbon groups of 1 to 15 carbon atoms which may contain a hetero atom. Alternatively, R$^{L07}$ to R$^{L16}$, taken together, may form a ring. Each of R$^{L07}$ to R$^{L16}$ represents a divalent C$_1$–C$_{15}$ hydrocarbon group which may contain a hetero atom, when they form a ring. Two of R$^{L07}$ to R$^{L16}$ which are attached to adjoining carbon atoms may bond together directly to form a double bond. Letter a is an integer of 0 to 6. Letter m is equal to 0 or 1, n is equal to 0, 1, 2 or 3, and 2m+n is equal to 2 or 3.

The dissolution regulator may be formulated in an amount of 0 to 50 parts, preferably 5 to 50 parts, and more preferably 10 to 30 parts, per 100 parts of the base resin, and may be used singly or as a mixture of two or more thereof. Less than 5 parts of the dissolution regulator may fail to yield an improved resolution, whereas the use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropyl-amine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylene-diamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethyl-ethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)-isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (B1) and (B2) may also be included.

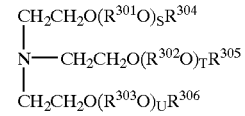

B1

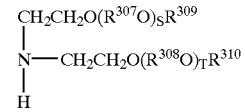

B2

In the formulas, $R^{301}$, $R^{302}$, $R^{303}$, $R^{307}$ and $R^{308}$ are independently straight, branched or cyclic alkylenes of 1 to 20 carbon atoms; $R^{304}$, $R^{305}$, $R^{306}$, $R^{309}$ and $R^{310}$ are hydrogen, alkyls of 1 to 20 carbon atoms, or amino; $R^{304}$ and $R^{305}$, $R^{304}$ and $R^{306}$, $R^{305}$ and $R^{307}$, $R^{304}$ with $R^{305}$ and $R^{306}$, and $R^{309}$ and $R^{310}$ may bond together to form rings; and S, T and U are each integers from 0 to 20, with the proviso that hydrogen is excluded from $R^{304}$, $R^{305}$, $R^{306}$, $R^{309}$ and $R^{310}$ when S, T and U are equal to 0.

The alkylene groups represented by $R^{301}$, $R^{302}$, $R^{303}$, $R^{307}$ and $R^{306}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{304}$, $R^{305}$, $R^{306}$, $R^{309}$ and $R^{310}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{304}$ and $R^{305}$, $R^{304}$ and $R^{306}$, $R^{305}$ and $R^{306}$, $R^{304}$ with $R^{305}$ and $R^{306}$, and $R^{309}$ and $R^{310}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (B1) and (B2) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10- diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)-ethyl}amine, tris[2-{(2-methoxyethoxy)methyl}ethyl]amine, and 1-aza-15-crown-5.

The basic compound is preferably formulated in an amount of 0.001 to 10 parts, and especially 0.01 to 1 part, per part of the photoacid generator. Less than 0.001 part of the basic compound fails to achieve the desired effects thereof, while the use of more than 10 parts would result in too low a sensitivity and resolution.

Other components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —R$^{401}$—COOH (wherein R$^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

[Group I]

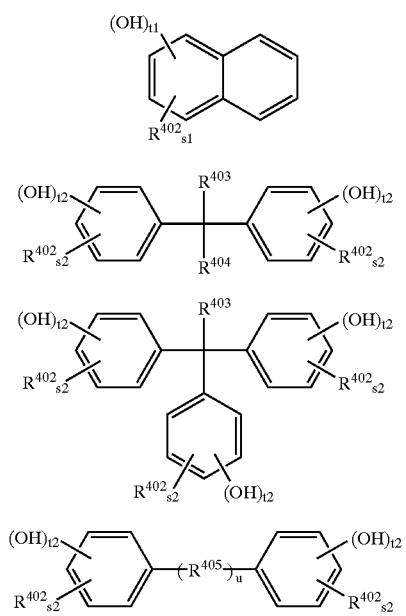

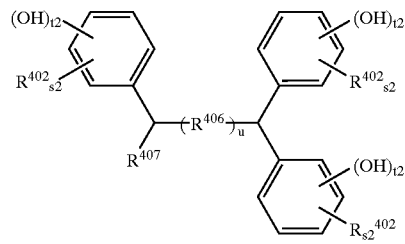

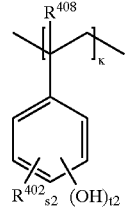

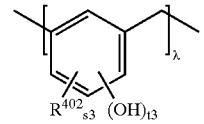

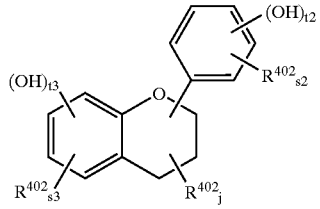

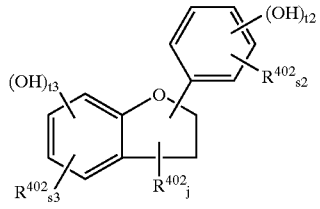

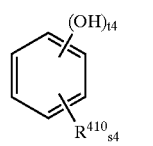

In these formulas, R$^{408}$ is hydrogen or methyl; R$^{402}$ and R$^{403}$ are each hydrogen or a straight or branched alkyl or alkenyl of 1 to 8 carbon atoms; R$^{404}$ is hydrogen, a straight or branched alkyl or alkenyl of 1 to 8 carbon atoms, or a —(R$^{409}$)$_h$—COOR' group (R' being hydrogen or —R$^{409}$—COOH); R$^{405}$ is —(CH$_2$)$_i$— (wherein i is 2 to 10), an arylene of 6 to 10 carbon atoms, carbonyl, sulfonyl, an oxygen atom, or a sulfur atom; R$^{406}$ is an alkylene of 1 to 10 carbon atoms, an arylene of 6 to 10 carbon atoms, carbonyl, sulfonyl, an oxygen atom, or a sulfur atom; R$^{407}$ is hydrogen, a straight or branched alkyl or alkenyl of 1 to 8 carbon atoms, or a hydroxyl-substituted phenyl or naphthyl; R$^{409}$ is a straight or branched alkylene of 1 to 10 carbon atoms; R$^{410}$ is hydrogen, a straight or branched alkyl or alkenyl of 1 to 8 carbon atoms, or a —R$^{411}$—COOH group; R$^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

[Group II]

A11
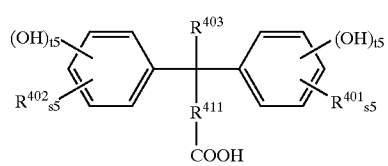

A12
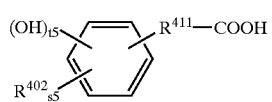

A13
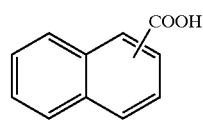

A14
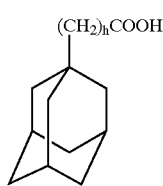

A15
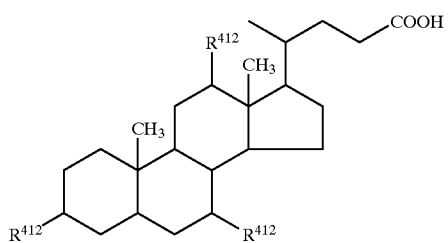

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a ≡C—COOH group include compounds of the general formulas AI-1 to AI-14 and AII-1 to AII-10 below.

AI-1
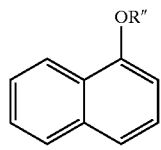

AI-2
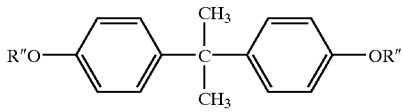

AI-3
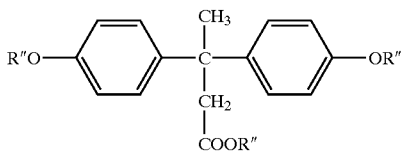

AI-4
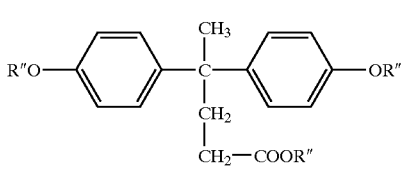

AI-5
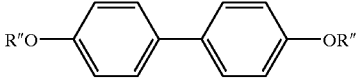

AI-6
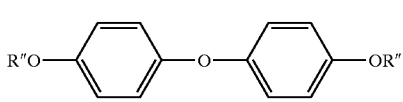

AI-7
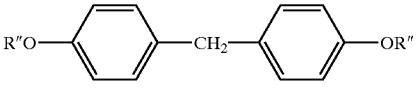

AI-8
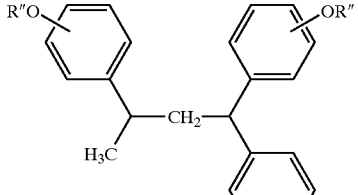

AI-9
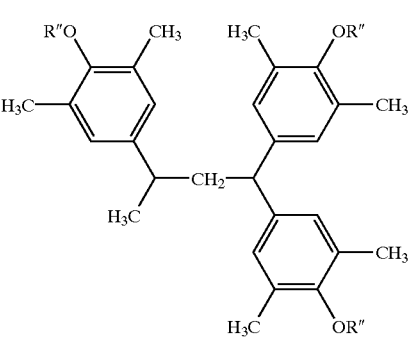

AI-10
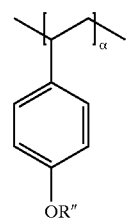

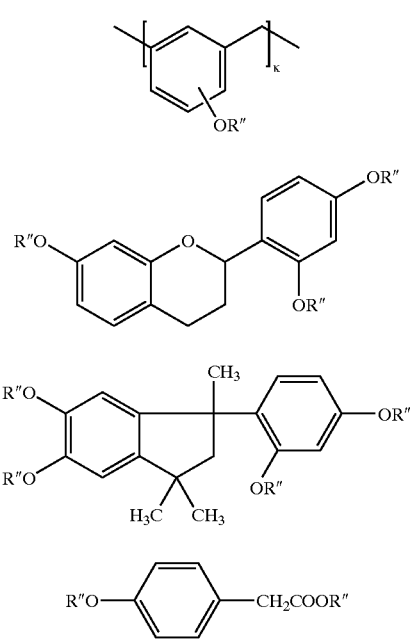

AI-11

AI-12

AI-13

AI-14

In the above formulas, R" is hydrogen or a CH₂COOH group such that the CH₂COOH group accounts for 10 to 100 mol % of R" in each compound, a and x are as defined above.

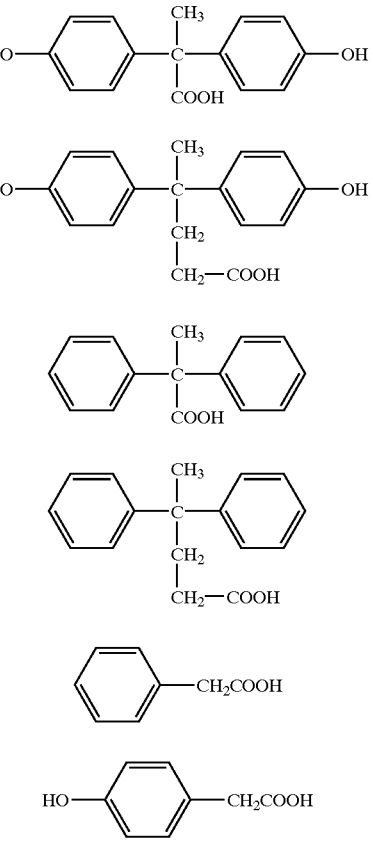

AII-1

AII-2

AII-3

AII-4

AII-5

AII-6

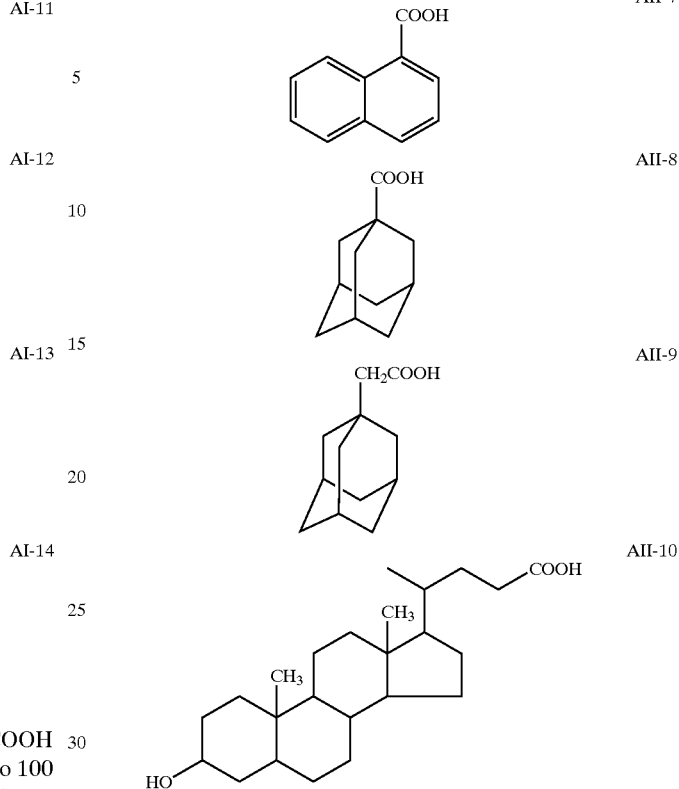

AII-7

AII-8

AII-9

AII-10

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

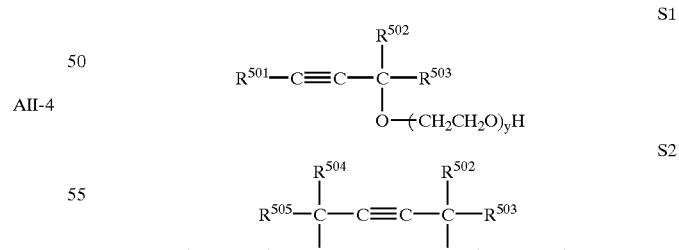

S1

S2

In the formulas, $R^{501}$, $R^{502}$, $R^{503}$, $R^{504}$, and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M K.K., Surflon S-141 and S-145 from Asahi Glass K.K., Unidine DS-401, DS-403 and DS-451 from Daikin Industry K.K., Megaface F-8151 from Dai-Nippon Ink & Chemicals K.K., and X-70-092 and X-70-093 from Shin-Etsu Chemical co., Ltd. Preferred surfactants are Florade FC-430 from Sumitomo 3M K.K. and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.3 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 193 to 248 nm, an excimer laser, x-rays, or an electron beam. The desired pattern may not be obtainable outside the upper and lower limits of the above range.

The resist composition comprising the polymer of the invention as a base resin lends itself to micropatterning with electron beams or deep-UV rays since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed.

EXAMPLE

Examples of the invention are given below by way of illustration and not by way of limitation.

First described are examples of synthesizing polymers.

Synthetic Example 1

Synthesis of Polymer 1

In 40 ml of tetrahydrofuran, 24.8 g of 1-ethylcyclopentyl 2-norbornene-5-acetate and 9.8 g of maleic anhydride were dissolved, and 0.7 g of 2,2'-azobisisobutyronitrile added. After agitation was continued for 15 hours at 60° C., 60 ml of tetrahydrofuran was added to the reaction solution, which was added dropwise to 2 liters of n-hexane. The resulting solids were collected by filtration, washed with 2 liters of n-hexane, and dried in vacuum at 40° C. for 6 hours, obtaining 23.1 g of a polymer, designated Polymer 1. The yield was 66.8%.

Synthetic Examples 2 to 16

Synthesis of Polymers 2 to 16

Polymers 2 to 16 were synthesized by the same procedure as Synthetic Example 1 or by a well-known method.

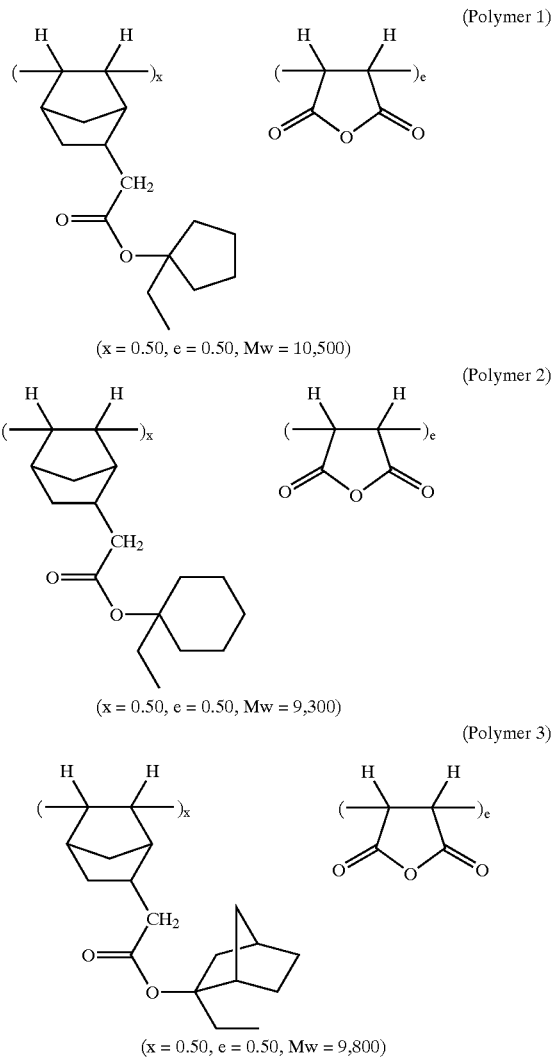

-continued
(Polymer 4)
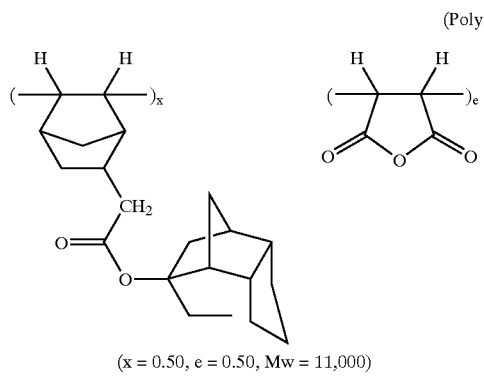
(x = 0.50, e = 0.50, Mw = 11,000)
(Polymer 5)
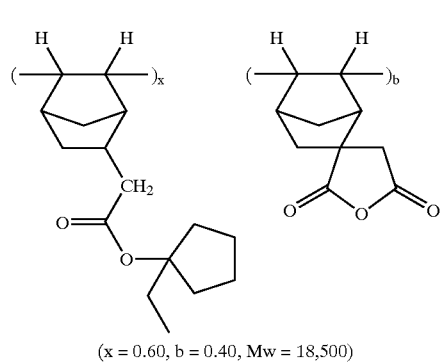
(x = 0.60, b = 0.40, Mw = 18,500)
(Polymer 6)
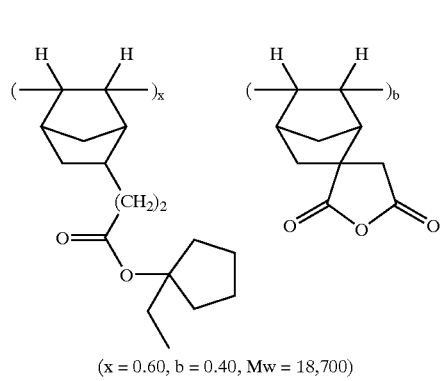
(x = 0.60, b = 0.40, Mw = 18,700)
(Polymer 7)
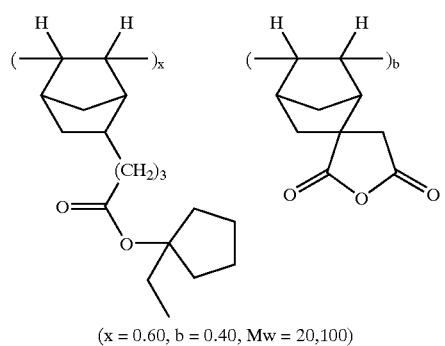
(x = 0.60, b = 0.40, Mw = 20,100)
-continued
(Polymer 8)
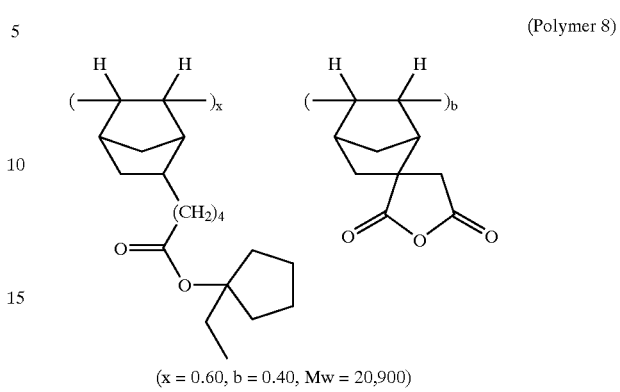
(x = 0.60, b = 0.40, Mw = 20,900)
(Polymer 9)
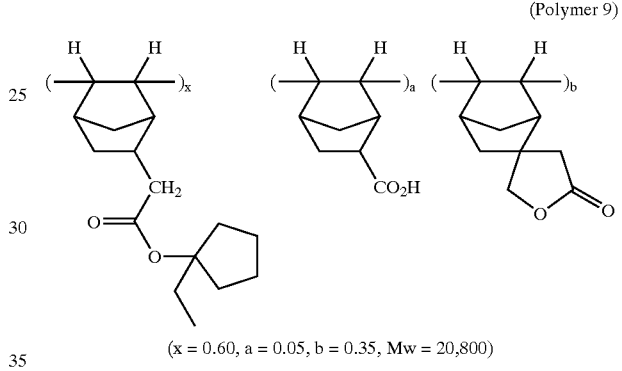
(x = 0.60, a = 0.05, b = 0.35, Mw = 20,800)
(Polymer 10)
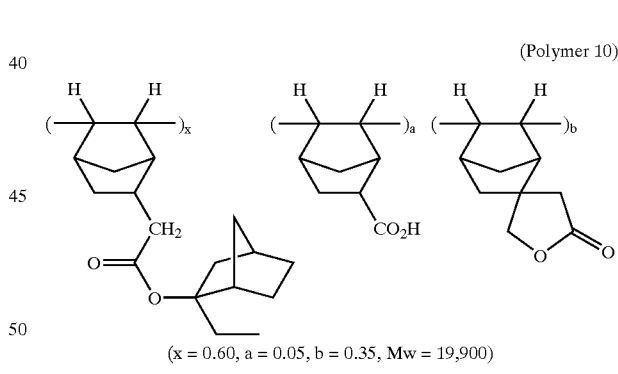
(x = 0.60, a = 0.05, b = 0.35, Mw = 19,900)
(Polymer 11)
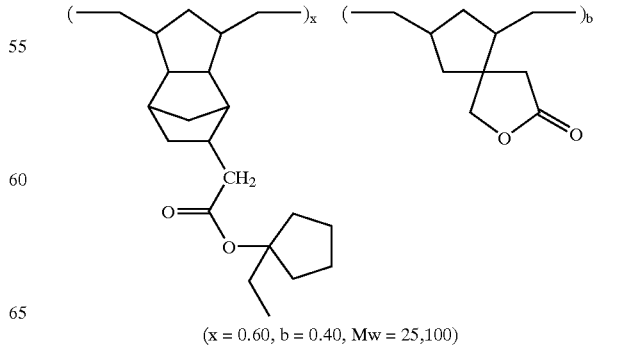
(x = 0.60, b = 0.40, Mw = 25,100)

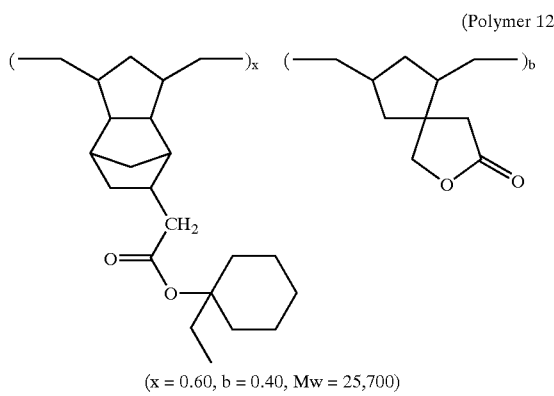

(Polymer 12)

(x = 0.60, b = 0.40, Mw = 25,700)

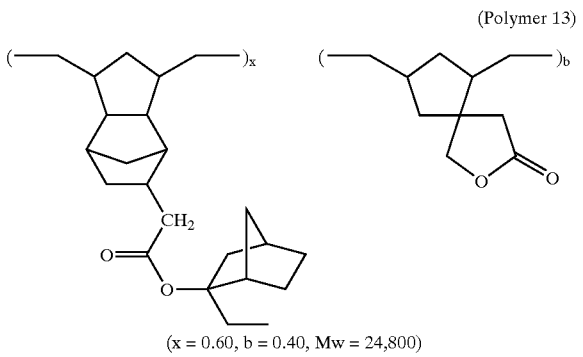

(Polymer 13)

(x = 0.60, b = 0.40, Mw = 24,800)

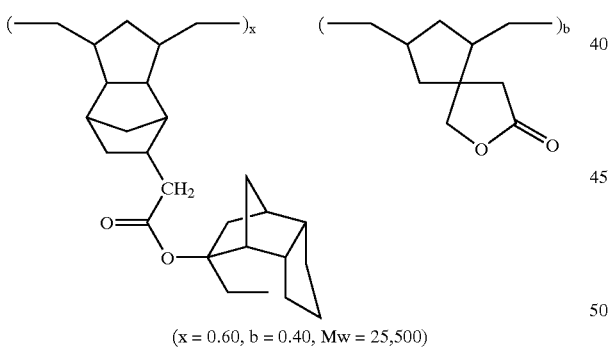

(Polymer 14)

(x = 0.60, b = 0.40, Mw = 25,500)

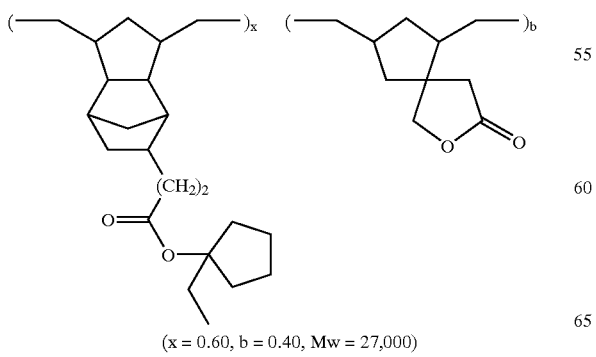

(Polymer 15)

(x = 0.60, b = 0.40, Mw = 27,000)

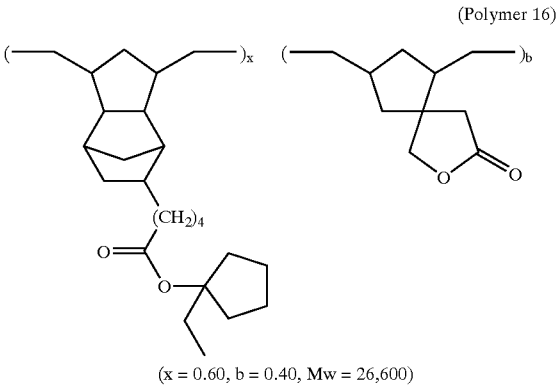

(Polymer 16)

(x = 0.60, b = 0.40, Mw = 26,600)

Example I

Resist compositions were formulated using inventive polymers and examined for resolution upon KrF excimer laser exposure.

Examples I-1 to I-30
Evaluation of Resist Resolution

Resist compositions were prepared by using Polymers 1 to 16 as the base resin, and dissolving the polymer, a photoacid generator (designated as PAG 1 and 2), a dissolution regulator (designated as DRR 1 to 4), a basic compound, and a compound having a ≡C—COOH group in the molecule (ACC 1 and 2) in a solvent containing 0.05% by weight of surfactant Florade FC-430 (Sumitomo 3M) in accordance with the formulation shown in Table 1. These compositions were each filtered through a 0.2 μm Teflon filter, thereby giving resist solutions.

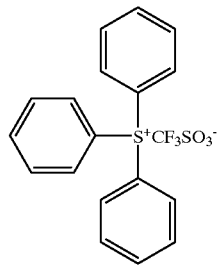

(PAG 1)

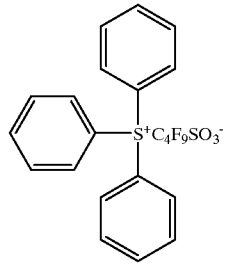

(PAG 2)

-continued (DRR 1)
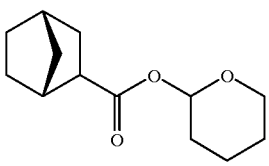

(DRR 2)
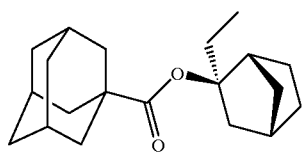

(DRR 3)
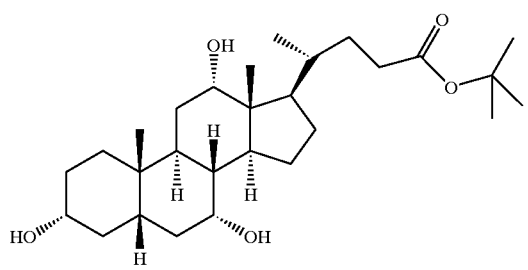

(DRR 4)
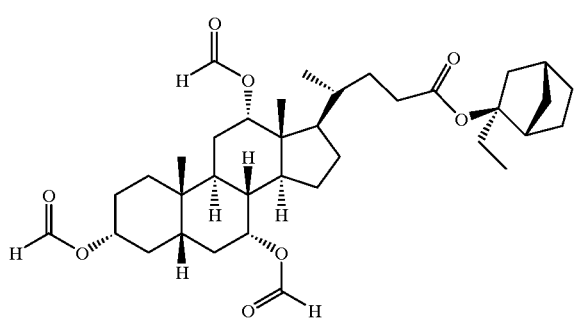

(ACC 1)
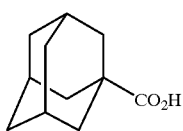

(ACC 2)
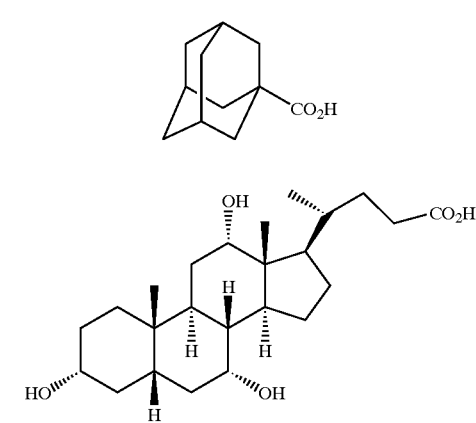

The solvents and basic compounds used are as follows.
CyHO: cyclohexanone
PGMEA: propylene glycol methyl ether acetate
PG/EL: a mixture of 70% PGMEA and 30% ethyl lactate
TBA: tributylamine
TEA: triethanolamine
TMMEA: trismethoxymethoxyethylamine
TMEMEA: trismethoxyethoxymethoxyethylamine These resist solutions were spin-coated onto silicon wafers, then baked at 130° C. for 90 seconds on a hot plate to give resist films having a thickness of 0.5 μm. The resist films were exposed using an KrF excimer laser stepper (Nikon Corporation; NA 0.5), then baked (PEB) at 110° C. for 90 seconds, and developed with a solution of 2.38% TMAH in water, thereby giving positive patterns.

The resulting resist patterns were evaluated as described below.

First, the sensitivity (Eth, mJ/cm$^2$) was determined. Next, the optimal dose (Eop, mJ/cm$^2$) was defined as the dose which provides a 1:1 resolution at the top and bottom of a 0.30 μm line-and-space pattern, and the resolution of the resist under evaluation was defined as the minimum line width (μm) of the lines and spaces that separated at this dose. The shape of the resolved resist pattern was examined under a scanning electron microscope.

The composition and test results of the resist materials are shown in Table 1.

Comparative Example

For comparison purposes, resist compositions were formulated and examined for resolution upon KrF excimer laser exposure.

Comparative Examples 1 to 4

Resist compositions were prepared as in Example I except that the following polymers, Polymers 17 to 20, were used as the base resin, in accordance with the formulation shown in Table 2.

(Polymer 17)
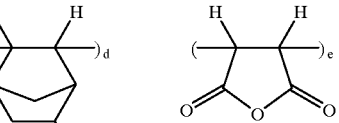
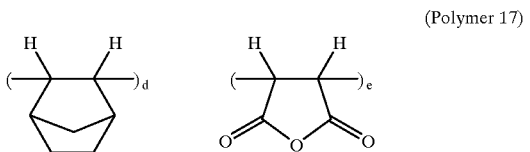
(d = 0.50, e = 0.50, Mw = 8,800)

(Polymer 18)
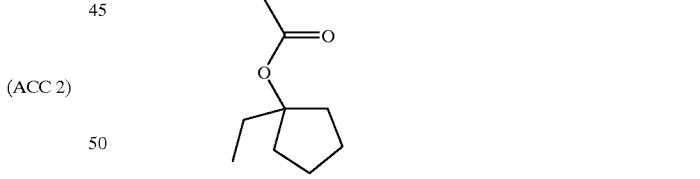
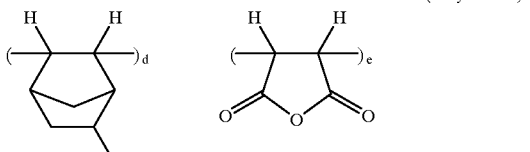
(d = 0.50, e = 0.50, Mw = 8,500)

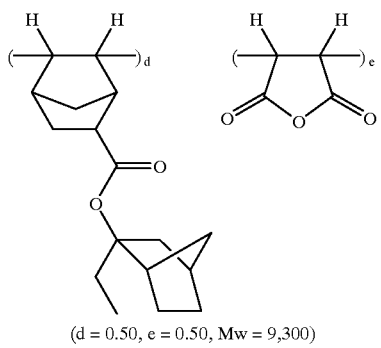

(Polymer 19)

(d = 0.50, e = 0.50, Mw = 9,300)

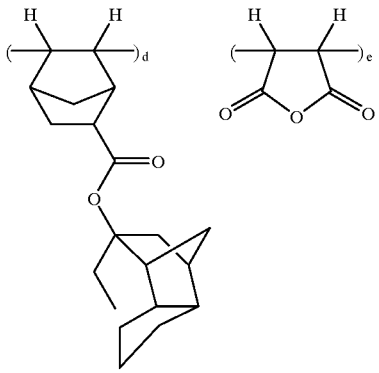

(Polymer 20)

(d = 0.50, e = 0.50, Mw = 10,100)

There resist materials were similarly evaluated. The composition and test results of these resist materials are shown in Table 2.

TABLE 1

| Example | Base resin | Photoacid generator | Dissolution regulator | Basic compound | Solvent | Optimum dose | Resolution | Shape |
|---|---|---|---|---|---|---|---|---|
| I-1 | Polymer 1 (80) | PAG 1(2) |  | TBA (0.125) | PG/EL (480) | 21.0 | 0.22 | rectangular |
| I-2 | Polymer 2 (80) | PAG 1(2) |  | TBA (0.125) | PG/EL (480) | 23.0 | 0.22 | rectangular |
| I-3 | Polymer 3 (80) | PAG 1(2) |  | TBA (0.125) | PG/EL (480) | 19.5 | 0.22 | rectangular |
| I-4 | Polymer 4 (80) | PAG 1(2) |  | TBA (0.125) | PG/EL (480) | 18.5 | 0.22 | rectangular |
| I-5 | Polymer 5 (80) | PAG 1(2) |  | TBA (0.125) | CyHO (480) | 18.0 | 0.22 | rectangular |
| I-6 | Polymer 6 (80) | PAG 1(2) |  | TBA (0.125) | CyHO (480) | 17.0 | 0.22 | rectangular |
| I-7 | Polymer 7 (80) | PAG 1(2) |  | TBA (0.125) | CyHO (480) | 17.0 | 0.22 | rectangular |
| I-8 | Polymer 8 (80) | PAG 1(2) |  | TBA (0.125) | CyHO (480) | 17.5 | 0.22 | rectangular |
| I-9 | Polymer 9 (80) | PAG 1(2) |  | TBA (0.125) | CyHO (480) | 17.0 | 0.22 | rectangular |
| I-10 | Polymer 10 (80) | PAG 1(2) |  | TBA (0.125) | CyHO (480) | 16.0 | 0.22 | rectangular |
| I-11 | Polymer 11 (80) | PAG 1(2) |  | TBA (0.125) | PGMEA (480) | 18.5 | 0.22 | rectangular |
| I-12 | Polymer 12 (80) | PAG 1(2) |  | TBA (0.125) | PGMEA (480) | 19.5 | 0.22 | rectangular |
| I-13 | Polymer 13 (80) | PAG 1(2) |  | TBA (0.125) | PGMEA (480) | 17.0 | 0.22 | rectangular |
| I-14 | Polymer 14 (80) | PAG 1(2) |  | TBA (0.125) | PGMEA (480) | 16.5 | 0.22 | rectangular |
| I-15 | Polymer 15 (80) | PAG 1(2) |  | TBA (0.125) | PGMEA (480) | 17.5 | 0.22 | rectangular |
| I-16 | Polymer 16 (80) | PAG 1(2) |  | TBA (0.125) | PGMEA (480) | 18.0 | 0.22 | rectangular |
| I-17 | Polymer 1 (80) | PAG 2(2) |  | TBA (0.125) | PG/EL (480) | 20.0 | 0.22 | rectangular |
| I-18 | Polymer 1 (80) | PAG 2(2) |  | TEA (0.125) | PG/EL (480) | 24.0 | 0.22 | rectangular |
| I-19 | Polymer 1 (80) | PAG 2(2) |  | TMMEA (0.125) | PG/EL (480) | 20.5 | 0.24 | rectangular |
| I-20 | Polymer 1 (80) | PAG 2(2) |  | TMEMEA (0.125) | PG/EL (480) | 19.0 | 0.24 | rectangular |
| I-21 | Polymer 3 (70) | PAG 1(2) | DRR 1 (10) | TEA (0.125) | PG/EL (480) | 17.0 | 0.22 | rectangular |
| I-22 | Polymer 3 (70) | PAG 1(2) | DRR 2 (10) | TEA (0.125) | PG/EL (480) | 19.0 | 0.22 | rectangular |
| I-23 | Polymer 3 (70) | PAG 1(2) | DRR 3 (10) | TEA (0.125) | PG/EL (480) | 23.0 | 0.22 | rectangular |
| I-24 | Polymer 3 (70) | PAG 1(2) | DRR 4 (10) | TEA (0.125) | PG/EL (480) | 21.0 | 0.22 | rectangular |

TABLE 1-continued

| Example | Base resin | Photoacid generator | Dissolution regulator | Basic compound | Solvent | Optimum dose | Resolution | Shape |
|---|---|---|---|---|---|---|---|---|
| I-25 | Polymer 5 (70) | PAG 1(2) | DRR 1 (10) | TEA (0.125) | CyHO (480) | 15.5 | 0.24 | rectangular |
| I-26 | Polymer 5 (70) | PAG 1(2) | DRR 2 (10) | TEA (0.125) | CyHO (480) | 18.0 | 0.22 | rectangular |
| I-27 | Polymer 5 (70) | PAG 1(2) | DRR 3 (10) | TEA (0.125) | CyHO (480) | 22.5 | 0.22 | rectangular |
| I-28 | Polymer 5 (70) | PAG 1(2) | DRR 4 (10) | TEA (0.125) | CyHO (480) | 19.0 | 0.22 | rectangular |
| I-29 | Polymer 11 (80) | PAG 1(2) | ACC 1 (4) | TEA (0.125) | PGMEA (480) | 20.0 | 0.22 | rectangular |
| I-30 | Polymer 11 (80) | PAG 1(2) | ACC 2 (4) | TEA (0.125) | PGMEA (480) | 23.0 | 0.24 | rectangular |

TABLE 2

| Comparative Example | Base resin | Photoacid generator | Dissolution regulator | Basic compound | Solvent | Optimum dose | Resolution | Shape |
|---|---|---|---|---|---|---|---|---|
| 1 | Polymer 17 (80) | PAG 1(2) | | TBA (0.125) | PG/EL (480) | 23.5 | 0.24 | rectangular |
| 2 | Polymer 18 (80) | PAG 1(2) | | TBA (0.125) | PG/EL (480) | 26.5 | 0.28 | T-top |
| 3 | Polymer 19 (80) | PAG 1(2) | | TBA (0.125) | PG/EL (480) | 23.0 | 0.24 | rectangular |
| 4 | Polymer 20 (80) | PAG 1(2) | | TBA (0.125) | PG/EL (480) | 21.5 | 0.22 | rectangular |

It is seen from Tables 1 and 2 that the resist compositions within the scope of the invention have a very high sensitivity and resolution upon KrF excimer laser exposure, as compared with prior art compositions.

Example II

Resist compositions were formulated using inventive polymers and examined for resolution upon ArF excimer laser exposure.

Examples II-1 to II-4
Evaluation of Resist Resolution

Resist compositions were prepared as in Example I in accordance with the formulation shown in Table 3.

The resulting resist solutions were spin-coated onto silicon wafers, then baked at 130° C. for 90 seconds on a hot plate to give resist films having a thickness of 0.5 μm. The resist films were exposed using an ArF excimer laser stepper (Nikon Corporation; NA 0.55), then baked (PEB) at 110° C. for 90 seconds, and developed with a solution of 2.38% TMAH in water, thereby giving positive patterns.

The resulting resist patterns were evaluated as described below. First, the sensitivity (Eth, mJ/cm$^2$) was determined. Next, the optimal dose (Eop, mJ/cm$^2$) was defined as the dose which provides a 1:1 resolution at the top and bottom of a 0.25 μm line-and-space pattern, and the resolution of the resist under evaluation was defined as the minimum line width (μm) of the lines and spaces that separated at this dose. The shape of the resolved resist pattern was examined under a scanning electron microscope.

The composition and test results of the resist materials are shown in Table 3.

TABLE 3

| Example | Base resin | Photoacid generator | Dissolution regulator | Basic compound | Solvent | Optimum dose | Resolution | Shape |
|---|---|---|---|---|---|---|---|---|
| II-1 | Polymer 1 (70) | PAG 1(1) | DRR 2 (10) | TEA (0.063) | PG/EL (480) | 19.5 | 0.16 | rectangular |
| II-2 | Polymer 2 (70) | PAG 1(1) | DRR 2 (10) | TEA (0.063) | PG/EL (480) | 21.0 | 0.16 | rectangular |
| II-3 | Polymer 3 (70) | PAG 1(1) | DRR 2 (10) | TEA (0.063) | PG/EL (480) | 18.5 | 0.16 | rectangular |
| II-4 | Polymer 4 (70) | PAG 1(1) | DRR 2 (10) | TEA (0.063) | PG/EL (480) | 18.5 | 0.16 | rectangular |

It is seen from Table 3 that the resist compositions within the scope of the invention have a very high sensitivity and resolution upon ArF excimer laser exposure.

Japanese Patent Application No. 11-302948 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising as a base resin a polymer comprising recurring units of the following formula (1-1) or (1-2) and having a weight average molecular weight of 1,000 to 500,000,

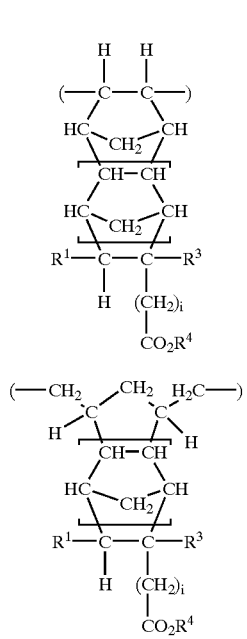

wherein $R^1$ is hydrogen, methyl or $CO_2R^2$, $R^2$ is a straight, branched or cyclic alkyl group of 1 to 15 carbon atoms, $R^3$ is hydrogen, methyl or $CH_2CO_2R^2$, $R^4$ is an acid labile group, i is an integer of 1 to 4, and k is equal to 0 or 1, and wherein the polymer comprising recurring units of the formula (1-1) or (1-2) is a polymer of one of the following formulae (2), (3) or (4):

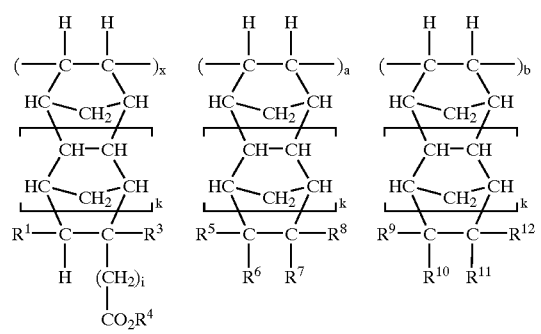

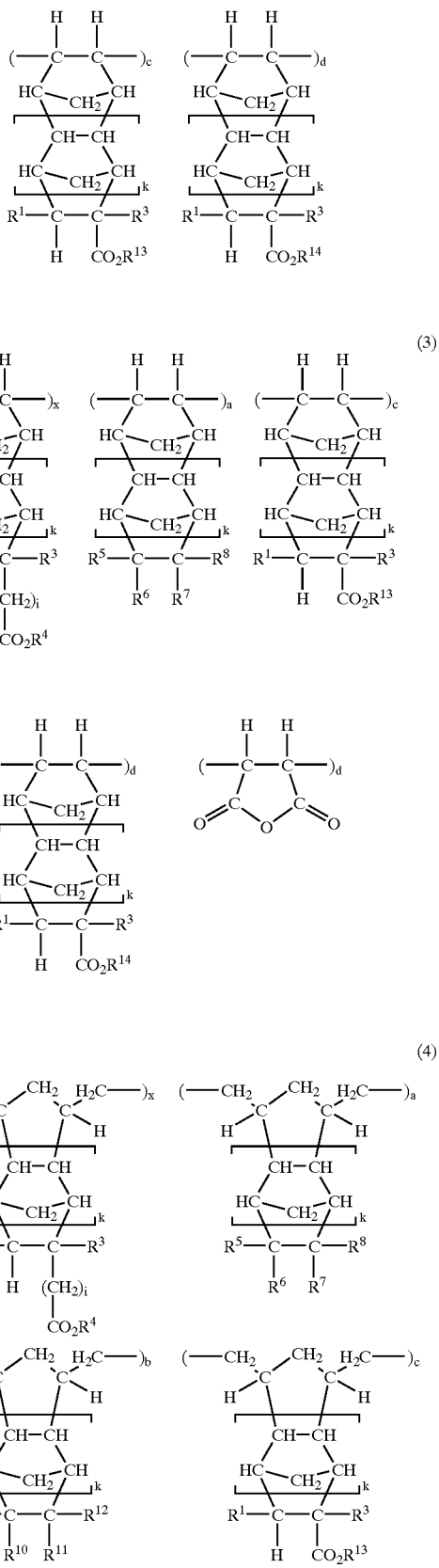

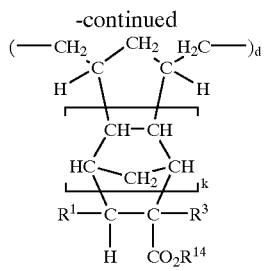

wherein
$R^1$ to $R^4$, i and k are as defined above,
at least one of $R^5$ to $R^8$ is a carboyl or hydroxyl-contaning monovalent hydrocarbon group of 1 to 15 carbon atoms, and the remainder are independently hydrogen or a straight, branched or cyclic alkyl group of 1 to 15 carboon atoms, or $R^5$ to $R^8$, taken together, may form a ring, and when they form a ring, at least one of $R^5$ to $R^8$ is a carboxyl or hydroxyl-containing divalent hydrocarbon group of 1 to 15 carbon atoms, and the remainder are independently a single bond or a straight, branched or cyclic alkylene group of 1 to 15 carbon atoms,
at least one of $R^9$ to $R^{12}$ is a monovalent hydrocarbon group of 2 to 15 carbon atoms containing a —$CO_2$— partial structure, and the remainder are independently hydrogen or a straight, branched or cyclic alkyl group of 1 to 15 carbon atoms, or $R^9$ to $R^{12}$, taken together, may form a ring, and when they form a ring, at least one of $R^9$ to $R^{12}$ is a divalent hydrocarbon group of 1 to 15 carbon atoms containing a —$CO_2$— partial structure, and the remainder are independently a single bond or a straight, branched or cyclic alkylene group of 1 to 15 carbon atoms,
$R^{13}$ is a polycyclic hydrocarbon group of 7 to 15 carbon atoms or an alkyl group containing such a polycyclic hydrocarbon group,
$R^{14}$ is an acid labile group,
X is a number from more than 0 to 1, and a to e are numbers from 0 to less than 1, satisfying x+a+b+c+d+e=1, provided that at least one of a to e is not 0;
and provided that at least one $R^4$ acid labile group contains a group of one of the following formula (5) or (6):

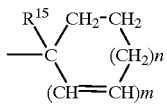

(5)

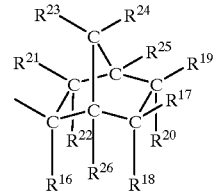

(6)

wherein
$R^{15}$ is a straight, branched or cyclic alkyl group of 1 to 8 carbon atoms or substituted or unsubstituted aryl group of 6 to 20 carbon atoms,
$R^{16}$ is a straight, branched or cyclic alkyl group of 1 to 8 carbon atoms or substituted or unsubstituted aryl group of 6 to 20 carbon atoms, $R^{17}$ to $R^{26}$ are independently hydrogen or monovalent hydrocarbon groups of 1 to 15 carbon atoms which may contain a hetero atom, or $R^{17}$ to $R^{26}$, taken together, may form a ring, and $R^{17}$ to $R^{26}$ represent divalent hydrocarbon groups of 1 to 15 carbon atoms which may contain a hetero atom when they form a ring, or two of $R^{17}$ to $R^{26}$ which are attached to adjoining carbon atoms may bond together directly to form a double bond,
m is a number equal to 0 or 1, is a number equal to 0, 1, 2, or 3, satisfying 2m+n=2 or 3.

2. The resist composition of claim 1, wherein x is from 0.1 to 0.9 and each of a to e is 0.7 or less.

3. The resist composition of claim 1 wherein in the polymer of the formula (2), (3) or (4), the acid labile group represented by $R^{14}$ contains a group of one of the following formula (5) or (6):

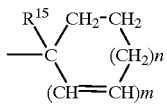

(5)

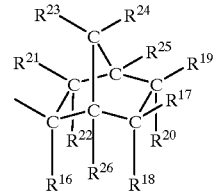

(6)

wherein
$R^5$ is a straight, branched or cyclic alkyl group of 1 to 8 carbon atoms or substituted or unsubstituted aryl group of 6 to 20 carbon atoms,
$R^{16}$ is a straight, branched or cyclic alkyl group of 1 to 8 carbon atoms or substituted or unsubstituted aryl group of 6 to 20 carbon atoms,
$R^{17}$ to $R^{26}$ are independently hydrogen or monovalent hydrocarbon groups of 1 to 15 carbon atoms which may contain a hetero atom, or $R^{17}$ to $R^{26}$, taken together, may form a ring, and $R^{17}$ to $R^{26}$ represent divalent hydrocarbon groups of 1 to 15 carbon atoms which may contain a hetero atom when they form a ring, or two of $R^{17}$ to $R^{26}$ which are attached to adjoining carbon atoms may bond together directly to form a double bond,
m is a number equal to 0 or 1, n is a number equal to 0, 1, 2 or 3, satisfying 2m+n=2 or 3.

4. The resist composition of claim 1, wherein in the polymer of formulae (2), (3) or (4), the acid labile groups represented by $R^4$ and $R^{14}$ are a tertiary alkyl group of 4 to 20 carbon atoms, a trialkylsilyl group where each alkyl group is of 1 to 6 carbon atoms, an oxoalkyl group of 4 to 20 carbon atoms of a group of formulae (L1) or (L2):

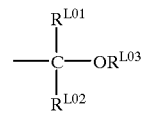

(L1)

-continued

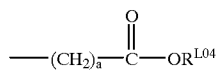
(L2)

where $R^{L01}$ and $R^{L02}$ are hydrogen or straight, branched or cyclic alkyl groups of 1 to 18 carbon atoms; $R^{L03}$ is a monovalent hydrocarbon group of 1 to 18 carbon atoms which may contain a hetero atom; optionally any two of $R^{L01}$, $R^{L02}$ and $R^{L03}$ may together be straight or branched chain alkylene of 1 to 18 carbon atoms forming a ring; $R^{L04}$ is a tertiary alkyl group of 4 to 20 carbon atoms, a trialkylsilyl group where each alkyl group is of 1 to 6 carbon atoms, an oxoalkyl group of 4 to 20 carbon atoms or a group of formula (L1); and, a is an integer from 0 to 6.

5. The resist composition of claim 1, wherein in the polymer of formulae (2), (3) or (4), there are two or more different acid labile groups.

6. The resist composition of claim 1, wherein the polymer of formulae (2), (3) or (4) has a molecular weight of 3,000 to 100,000.

7. The resist composition of claim 1, wherein the resist composition further comprises a photoacid generator and organic solvent.

8. A process for forming a resist pattern comprising the steps of:
applying a resist composition according to claim 1 onto a substrate to form a coating,
heat treating the coating and then exposing it to high-energy radiation or electron beams through a photo mask, and
optionally heat treating the exposed coating and developing it with a developer.

* * * * *